(12) United States Patent
Lu

(10) Patent No.: US 10,418,979 B2
(45) Date of Patent: Sep. 17, 2019

(54) JITTER-FREE RING OSCILLATOR

(71) Applicant: CORE CHIP TECHNOLOGY (NANJING) CO., LTD., Nanjing, Jiangsu Province (CN)

(72) Inventor: Teh-Shang Lu, Sunnyvale, CA (US)

(73) Assignee: Core Chip Technology (Nanjing) Co., Ltd., Nanjing, Jiangsu Province (CN)

( * ) Notice: Subject to any disclaimer, the term of this patent is extended or adjusted under 35 U.S.C. 154(b) by 83 days.

(21) Appl. No.: 15/693,343

(22) Filed: Aug. 31, 2017

(65) Prior Publication Data

US 2019/0068174 A1    Feb. 28, 2019

(51) Int. Cl.
*H03K 3/03* (2006.01)
*H03K 3/013* (2006.01)

(52) U.S. Cl.
CPC .......... *H03K 3/0322* (2013.01); *H03K 3/013* (2013.01); *H03K 3/0315* (2013.01)

(58) Field of Classification Search
CPC .......................... H03K 3/0322; H03K 3/0315
See application file for complete search history.

(56) References Cited

U.S. PATENT DOCUMENTS

| | | | |
|---|---|---|---|
| 5,239,274 A | 8/1993 | Chi | |
| 5,490,182 A | 2/1996 | Arai | |
| 5,565,817 A * | 10/1996 | Lakshmikumar | .... H03K 3/0315 327/237 |
| 6,469,585 B1 * | 10/2002 | Dai | ...................... H03K 3/0322 327/276 |
| 6,617,936 B2 | 9/2003 | Dally et al. | |
| 6,690,243 B1 | 2/2004 | Henrion | |
| 7,167,056 B2 * | 1/2007 | Fang | ...................... H03L 7/0891 331/167 |
| 7,394,325 B2 * | 7/2008 | Ueno | ...................... H03B 27/00 331/57 |
| 7,863,991 B1 * | 1/2011 | Iravani | ................. H03K 3/0322 331/177 R |
| 8,729,944 B2 * | 5/2014 | Doyle | ................... H03L 7/0996 327/256 |

(Continued)

OTHER PUBLICATIONS

International Search Report and Written Opinion, PCT/US2018/036053, dated Sep. 10, 2018.

*Primary Examiner* — Ryan Johnson
(74) *Attorney, Agent, or Firm* — Edward C. Kwok; VLP Law Group, LLP

(57) ABSTRACT

A ring oscillator includes: (i) one or more current sources each connected to a supply voltage source; and (ii) oscillation elements connected in series in a ring configuration each element including: (a) first and second input terminals; (b) first and second output terminals; (c) first and second inverters receiving input signals from the first and second input terminals, respectively, and providing output signals on the first and second output terminals, respectively; and (d) third and fourth inverters, each having an input terminal and an output terminal, wherein the input terminals of the third and fourth inverters are coupled to the first and second output terminals of the oscillator element, respectively, wherein the output terminals of third and fourth inverters are coupled to the second and first output terminals of the oscillator element, respectively, and wherein each of first, second, third and fourth inverters are coupled to the supply voltage source through the current sources.

4 Claims, 5 Drawing Sheets

(56) References Cited

U.S. PATENT DOCUMENTS

| | | |
|---|---|---|
| 2003/0076179 A1 | 11/2003 | Branch et al. |
| 2006/0197614 A1 | 9/2006 | Roubada et al. |
| 2009/0261909 A1 | 10/2009 | Fujino |
| 2014/0327486 A1 | 11/2014 | Roine et al. |

* cited by examiner

US 10,418,979 B2

JITTER-FREE RING OSCILLATOR

BACKGROUND OF THE INVENTION

The present invention relates to oscillator circuits. In particular, the present invention relates to ring oscillator circuits jitter-free.

SUMMARY

According to one embodiment of the present invention, a ring oscillator includes: (i) one or more current sources each connected to a supply voltage source; and (ii) oscillation elements connected in series in a ring configuration, each oscillation element including: (a) first and second input terminals; (b) first and second output terminals; (c) first and second inverters receiving input signals from the first and second input terminals, respectively, and providing output signals on the first and second output terminals, respectively; and (d) third and fourth inverters, each having an input terminal and an output terminal, wherein the input terminals of the third and fourth inverters are coupled to the first and second output terminals of the oscillator element, respectively, wherein the output terminals of third and fourth inverters are coupled to the second and first output terminals of the oscillator element, respectively, and wherein each of first, second, third and fourth inverters are coupled to the supply voltage source through the current sources.

According to one embodiment of the present invention, the first and second inverters of each oscillator element are larger than the third and fourth inverters of the same oscillator element.

According to one embodiment of the present invention, two or more of the current sources are each connected to a separate group of the oscillator elements. The oscillator elements in each group provide output signals that bear a predetermined phase relationship relative to each other, such as, for example, one or more times of ±90°.

The present invention is better understood upon consideration of the detailed description below, in conjunction with the accompanying drawings.

BRIEF DESCRIPTION OF THE DRAWINGS

FIG. 3 shows ring oscillator 400 in which current sources 105a-1 and 105c-1, 105a-2 and 105c-2, 105b-1 and 150d-1, 105b-2 and 105d-2, respectively are tied together, in accordance with one embodiment of the present invention.

To facilitate cross-referencing among the figures and to simplify the detailed description, like elements in the figures are assigned like reference numerals.

DETAILED DESCRIPTION OF THE PREFERRED EMBODIMENTS

Figure 1:
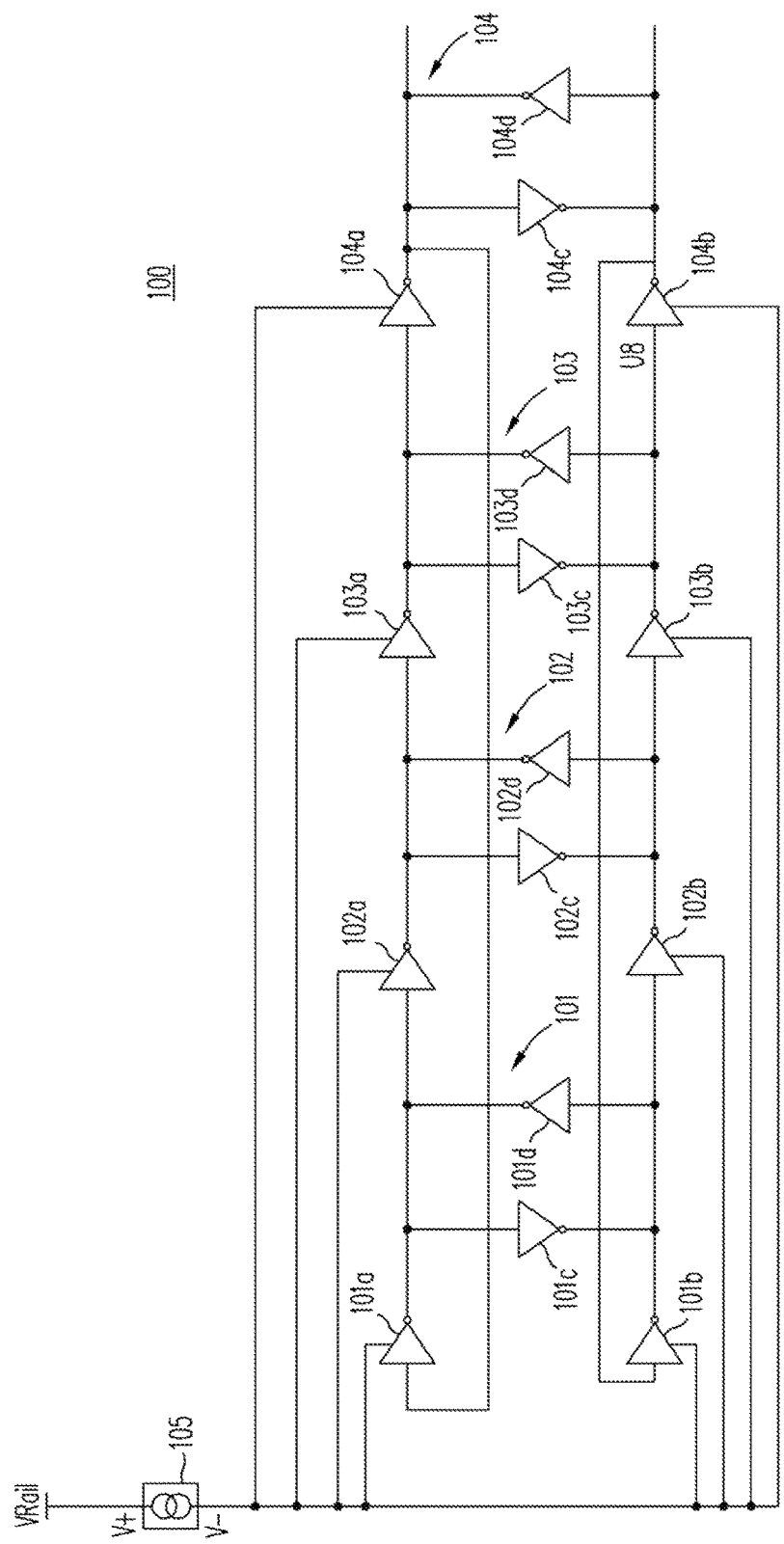
FIG. 1 shows ring oscillator 100 including four oscillator elements 101-104, in accordance with one embodiment of the present invention.

The present invention provides a ring oscillator that includes a number of serially-connected oscillator elements. FIG. 1 shows ring oscillator 100 including four oscillator elements 101-104, in accordance with one embodiment of the present invention. In FIG. 1, oscillator elements 101-104 are connected in series, with each oscillator element having two input terminals and two output terminals. The output terminals of oscillator element 104 is connected back to the input terminals of oscillator element 101, thereby forming a ring. Although ring oscillator 100 is shown to have four oscillator elements, in general, any number of oscillator elements may be used in a ring oscillator of the present invention. As shown in FIG. 1, each oscillator element includes four inverters. For example, oscillator element 101 includes inverter 101a, 101b, 101c and 101d, and oscillator element 102 includes inverter 102a, 102b, 102c and 102d. Typically, inverters 101a and 101b are implemented by transistors that are each several times (e.g., four times) larger than corresponding transistors in inverters 101c and 101d. In this context, a "larger" inverter draws a greater current than a "smaller" inverter for a given signal transition in the inverter. Current source 105 connects each inverter to a power supply voltage. Although not shown, each inverter may also be connected through a second current source to a ground voltage. Current source 105 may be implemented, for example, by an MOS transistor receiving a conventional reference or bias voltage generated using current mirrors.

Figure 2:
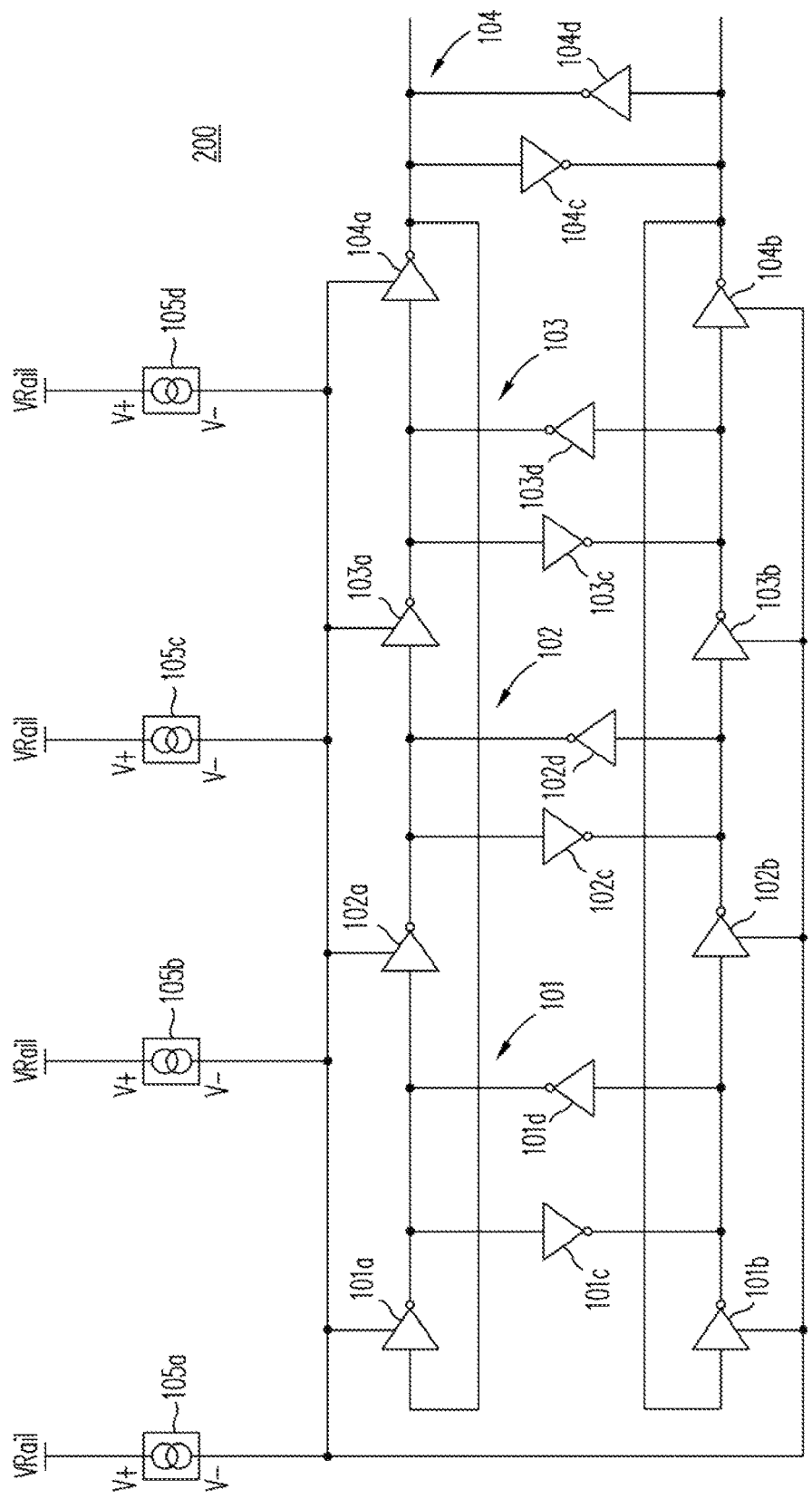
FIG. 2 shows ring oscillator 200 having current sources 105a, 105b, 105c and 105d, in accordance with one embodiment of the present invention.

In ring oscillator 100, each oscillator element can be in either a metastable state or an oscillating state. In the metastable state, the voltage at each terminal of each transistor in the oscillator element (e.g., transistors 101a, 101b, 101c and 101d) is one-half the supply voltage. Any slight disturbance would move the oscillator element into the oscillating state. In the oscillating state, the smaller inverters (e.g., inverters 101c and 101d) ensure that the output terminals of the larger inverters (e.g., inverters 101a and 101b) to be 180° out of phase with each other by help driving the output terminals of the larger transistors in opposite directions. In steady state, the output terminals of each inverter in the oscillator element is sinusoidal. As shown in FIG. 1, as there are 4 oscillator elements, the output signals of each oscillator element are 45° relative to the signals at its input terminals. Thus, oscillator elements 101, 102, 103 and 104 may be described as being at 0°, 45°, 90° and 180°, For a ring oscillator with many oscillator elements, current sources may be distributed to avoid effects resulting from resistance in long power supply lines. For example, FIG. 2 shows ring oscillator 200 having current sources 105a, 105b, 105c and 105d, in accordance with one embodiment of the present invention. In ring oscillator 200, current sources 105a, 105b, 105c and 105d may each be placed close to the corresponding oscillator elements 101-104. In addition, current sources 105a, 105b, 105c and 105d each need only supply up to ¼ of the current in current source 105. In ring oscillator 200, current sources 105a, 105b and 105c and 105d are connected in common.

Figure 3:
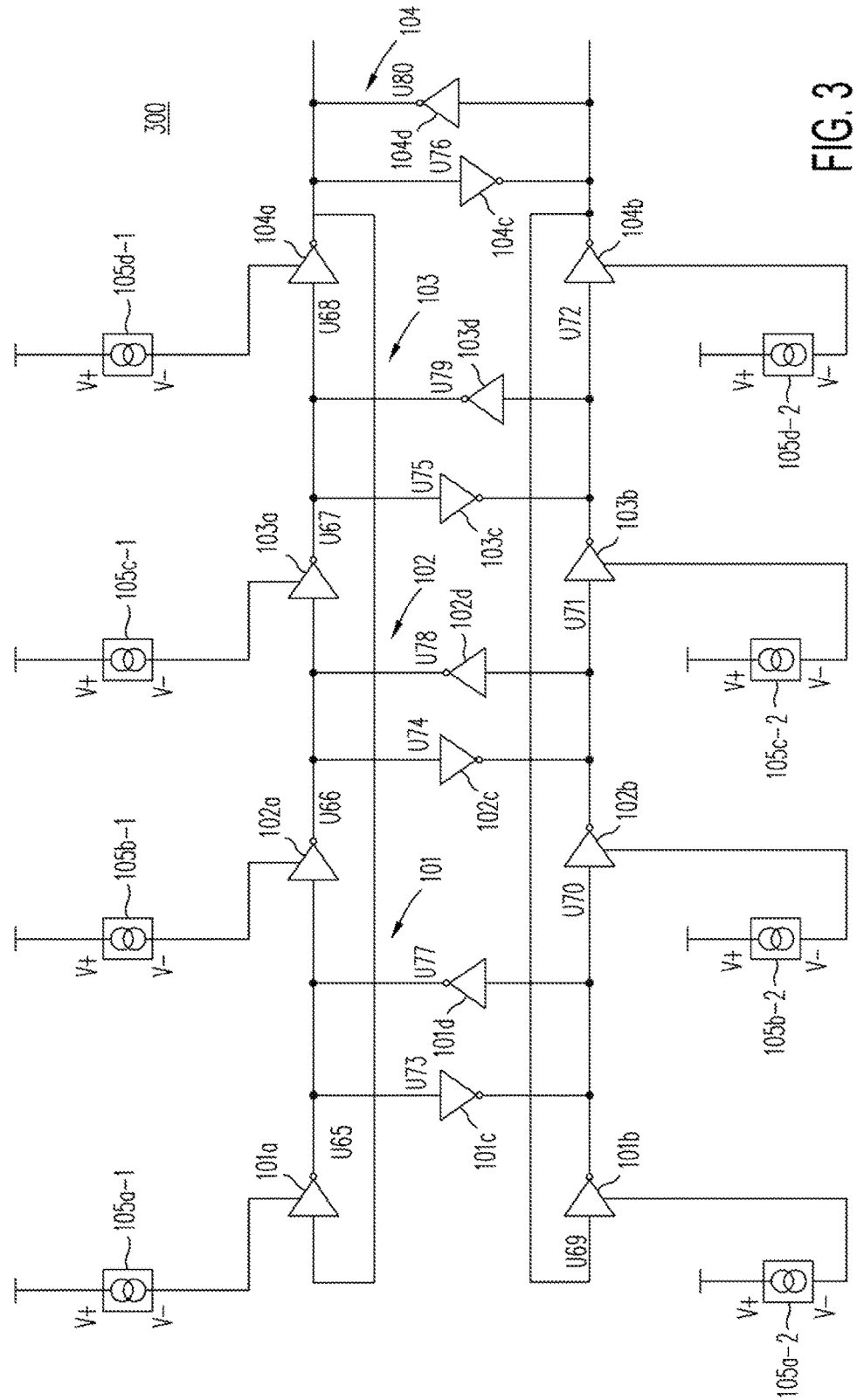
FIG. 3 shows ring oscillator 300 having current sources 105a-1, 105a-2, 105b-1, 105b-2, 105c-1, 105c-2, 105d-1 and 105-d2, in accordance with one embodiment of the present invention.

Each of current sources 105a, 105b, 105c and 105d may also be distributed. For example, FIG. 3 shows ring oscillator 300 having current sources 105a-1, 105a-2, 105b-1, 105b-2, 105c-1, 105c-2, 105d-1 and 105-d2, in accordance with one embodiment of the present invention. In ring oscillator 300, two current sources may be placed close to each oscillator element. For example, current sources 105a-1 and 105a-2 may be placed close to oscillator element 101. In this arrangement, each current source may connect one of the larger inverters in the oscillator element and one of the smaller inverters in the oscillator element. For example, current source 105a-1 may connect inverters 101a and 101c to a power supply line, while current source 105a-2 may connect inverters 101b and 101d to a power supply line. Using this approach, current sources 105a-1 and 105a-2 may each be, for example, half the size of current source 150a of ring oscillator 200. In FIG. 3, current sources 105a-1, 105a-2, 105b-1, 105b-2, 105c-1, 150c-2, 105d-1 and 105d-2 are not tied together.

Figure 4:
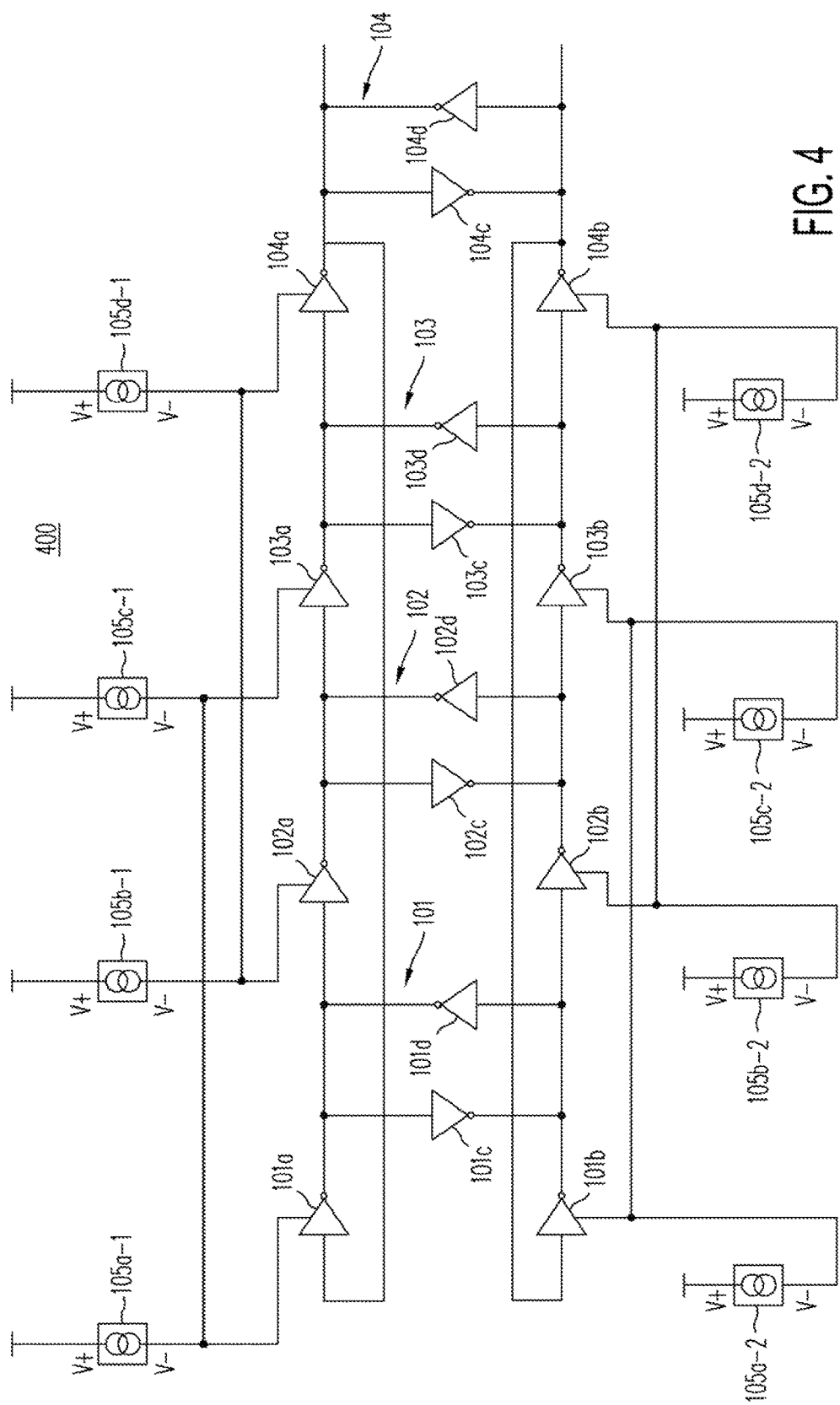

One may observe that the difference in instantaneous currents drawn by oscillator elements that are 90° apart is less than one half the amplitude between the maximum and the minimum current drawn in each oscillator element. For example, when oscillator element 101(0°) draws maximum current, oscillator 103(90°) draws zero current. Tying current sources 105a-1 and 105c-1 of ring oscillator 300 together (and, likewise, current sources 105a-2 and 105-c2 together) allow even lesser total currents. Such a configuration is shown in FIG. 4. FIG. 3 shows ring oscillator 400 in which current sources 105a-1 and 105c-1, 105a-2 and 105c-2, 105b-1 and 150d-1, 105b-2 and 105d-2, respectively are tied together, in accordance with one embodiment of the present invention.

Figure 5:
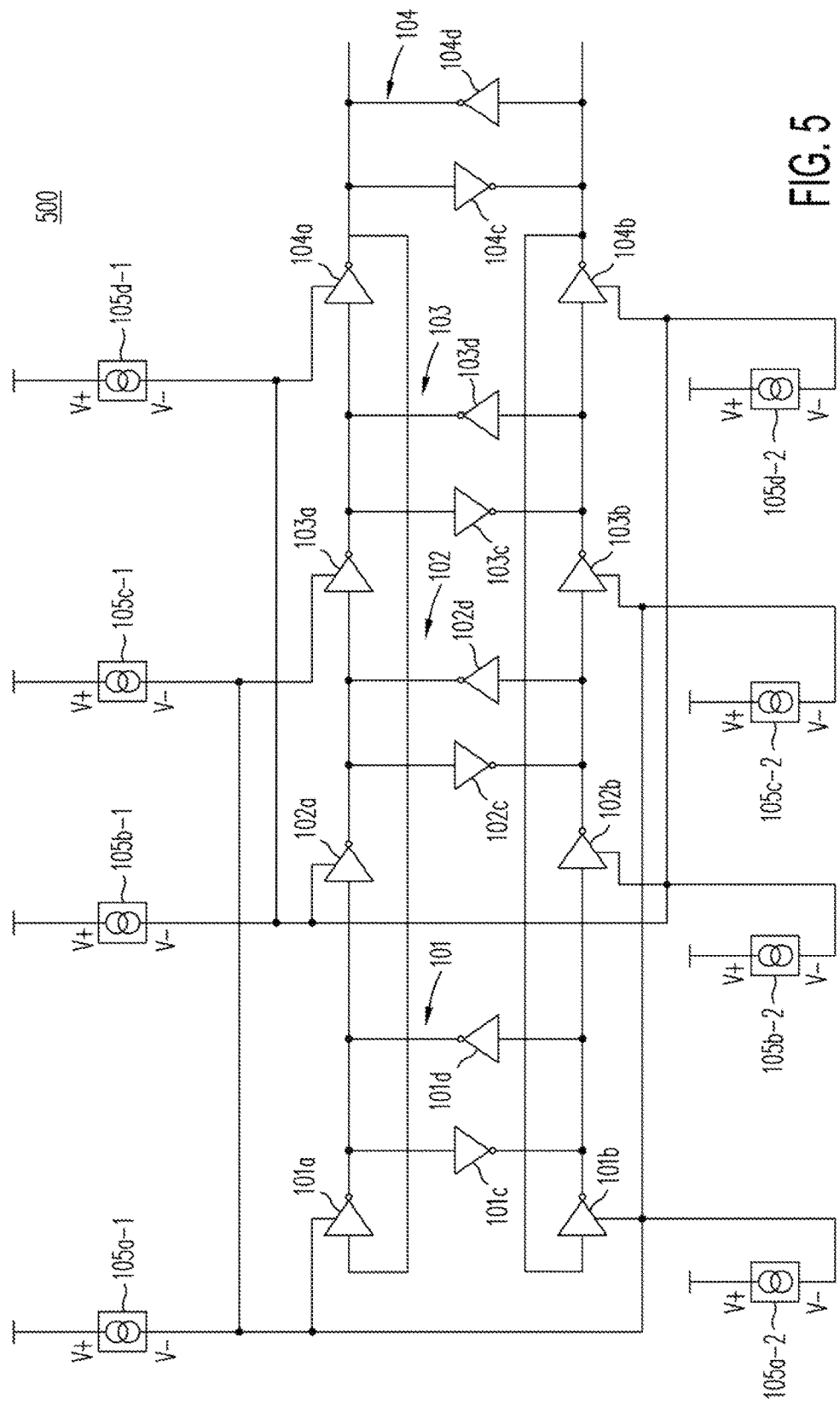
FIG. 5 is an alternative embodiment in which the current sources supplying oscillator elements that are ±90° apart are tied together, in accordance with one embodiment of the present invention.

FIG. 5 is an alternative embodiment in which the current sources supplying oscillator elements that are ±90° apart are tied together, in accordance with one embodiment of the present invention. For example, current sources 105a-1, 105a-2, 105c-1 and 105c-2 are tied together. Likewise, current sources 105b-1, 105b-2, 105d-1 and 105d-2 are tied together.

The detailed description above is provided to illustrate specific embodiments of the present invention and is not intended to be limiting. Numerous modifications and variations within the present invention are possible. The present invention is set forth in the accompanying claims.

I claim:

1. A ring oscillator, which comprises:
a plurality of current sources each connected to a supply voltage source; and
a plurality of oscillation elements connected in series in a ring configuration, wherein successive oscillator elements in the series draw currents from different current sources and wherein at least two of the oscillator elements draw current from one of the current sources, each oscillator element comprising:
first and second input terminals;
first and second output terminals;
first and second inverters receiving input signals from the first and second input terminals, respectively, and providing output signals on the first and second output terminals, respectively; and
third and fourth inverters, each having an input terminal and an output terminal, wherein the input terminals of the third and fourth inverters are coupled to the first and second output terminals of the oscillator element, respectively, wherein the output terminals of third and fourth inverters are coupled to the second and first output terminals of the oscillator element, respectively, and wherein the current sources providing currents to the oscillator element couple the first, the second, the third and the fourth inverters to the supply voltage source.

2. The ring oscillator of claim 1, wherein the first and second inverters are each larger than either one of the third and fourth inverters.

3. The ring oscillator of claim 1, wherein the successive oscillator elements provide output signals on their respective first output terminals that bear a predetermined phase relationship relative to each other.

4. The ring oscillator of claim 3, wherein the predetermined phase relationship is one or more times of ±90°.

* * * * *